US007999465B2

(12) United States Patent
Yee et al.

(10) Patent No.: US 7,999,465 B2
(45) Date of Patent: Aug. 16, 2011

(54) ORGANIC LIGHT EMITTING DIODE (OLED) DISPLAY DEVICE

(75) Inventors: Dong-Su Yee, Suwon-si (KR); Kuen-Dong Ha, Suwon-si (KR); Chan-Kyoung Moon, Suwon-si (KR); Hyun-Hee Lee, Suwon-si (KR); Ji-Ho Kang, Suwon-si (KR); Oh-June Kwon, Suwon-si (KR); Jung-Jun Im, Suwon-si (KR); Hyun-Min Hwang, Suwon-si (KR); Jae-Wook Lee, Suwon-si (KR); Song-Hark Lee, Suwon-si (KR); Joung-Chung Kim, Suwon-si (KR); Min-Su Kim, Suwon-si (KR)

(73) Assignee: Samsung Mobile Display Co., Ltd., Nongseo-Dong, Giheung-Gu, Yongin, Gyunggi-Do (KR)

( * ) Notice: Subject to any disclaimer, the term of this patent is extended or adjusted under 35 U.S.C. 154(b) by 149 days.

(21) Appl. No.: 12/318,855

(22) Filed: Jan. 9, 2009

(65) Prior Publication Data

US 2009/0179557 A1 Jul. 16, 2009

(30) Foreign Application Priority Data

Jan. 16, 2008 (KR) .................. 10-2008-0004924

(51) Int. Cl.
*H01J 1/62* (2006.01)
*H01L 51/50* (2006.01)
(52) U.S. Cl. ....................................... 313/506

(58) Field of Classification Search .......... 313/498–512, 313/582–587, 17, 269; 362/561, 615, 633
See application file for complete search history.

(56) References Cited

U.S. PATENT DOCUMENTS

| 2006/0072051 A1* | 4/2006 | Kang et al. ............. 349/58 |
| 2006/0114689 A1* | 6/2006 | Chang et al. ............ 362/561 |
| 2006/0203141 A1* | 9/2006 | Lee ........................ 349/58 |
| 2007/0126335 A1* | 6/2007 | You et al. ................ 313/485 |
| 2007/0132361 A1* | 6/2007 | Chung et al. ............ 313/493 |

FOREIGN PATENT DOCUMENTS

| KR | 1020000004781 | 1/2000 |
| KR | 100692687 | 3/2007 |
| KR | 1020070077834 A | 7/2007 |
| KR | 1020070087310 | 8/2007 |
| WO | WO 2006/134014 | * 12/2006 |

OTHER PUBLICATIONS

The Grades and Properties of Elastosil LR Liquid Silicone Rubber by Wacker Chemicals.*
Korean Notice of decision to grant a patent issued by Korean Patent office on Aug. 19, 2009 corresponding to the Korean Patent Application No. 10-2008-0004924.

* cited by examiner

*Primary Examiner* — Toan Ton
*Assistant Examiner* — Zachary Snyder
(74) *Attorney, Agent, or Firm* — Robert E. Bushnell, Esq.

(57) ABSTRACT

An Organic Light Emitting Diode (OLED) display reduces damage to a panel assembly with an improved bezel structure. The OLED display includes a panel assembly including a display area, a pad area, and a plurality of OLEDs arranged in the display area and a bezel attached to the panel assembly. The bezel is has a rebound resilience in a range of 50-70%. The bezel is made of a silicon-based rubber.

9 Claims, 8 Drawing Sheets

ORGANIC LIGHT EMITTING DIODE (OLED) DISPLAY DEVICE

CLAIM OF PRIORITY

This application makes reference to, incorporates the same herein, and claims all benefits accruing under 35 U.S.C. §119 from an application for ORGANIC LIGHT EMITTING DIODE DISPLAY earlier filed in the Korean Intellectual Property Office on the 16 of Jan. 2008 and there duly assigned Serial No. 10-2008-0004924.

BACKGROUND OF THE INVENTION

1. Field of the Invention

The present invention relates to an Organic Light Emitting Diode (OLED) display. More particularly, the present invention relates to an OLED display that reduces the damage of a panel assembly, which may be caused by impact upon being dropped, by having an improved bezel supporting the panel assembly.

2. Description of the Related Art

An OLED display includes a plurality of OLEDs each having a hole injection electrode, an organic light emitting layer, and an electron injection electrode. The OLEDs emit light using energy generated when excitons generated by electron-hole combinations in the organic light emitting layer drop from the excitation state to the ground state.

By the above principle, OLED displays have a self-emissive characteristic. Therefore, unlike Liquid Crystal Displays (LCDs), OLED displays do not require a separate light source and thus, their thickness and weight can be reduced. Furthermore, OLED displays have a variety of desirable properties, such as low power consumption, high luminance, quick response, and the like. Therefore, OLED displays are drawing attention as the upcoming alternative displays for portable electronic devices.

A typical OLED display includes a panel assembly in which OLEDs are formed, a bezel coupled to the panel assembly at a rear side of the panel assembly, and a Printed Circuit Board (PCB) electrically connected to the panel assembly by a Flexible Printed Circuit Board (FPCB).

The panel assembly of such an OLED display has two thin substrates. In addition, unlike the LCD in which the interior of a panel assembly is filled with liquid crystal, the OLED display has empty spaces inside of the panel assembly. Therefore, the mechanical strength of the OLED display is not sufficient. Particularly, the typical OLED display is configured such that the panel assembly is protected by only the metal bezel. That is, no absorption member for absorbing external impact is provided in the typical OLED display.

Therefore, when a user accidentally drops an electronic device having such an OLED display, a relatively large torsion load and/or a relatively large bending load is applied to the bezel, to deform the bezel. As a result, the torsion load and/or the bending load are transferred to the panel assembly coupled to the bezel. This may cause damage to the panel assembly.

SUMMARY OF THE INVENTION

The present invention provides an OLED display that reduces the damage of a panel assembly, which may be caused by impact upon being dropped, by having an improved bezel supporting the panel assembly.

According to an exemplary embodiment of the present invention, an Organic Light Emitting Diode (OLED) display includes a panel assembly having a display area, a pad area, and a plurality of OLEDs formed in the display area and a bezel attached to the panel assembly. The bezel is formed to have rebound resilience of 50-70%.

The bezel may be formed of silicon-based rubber. The bezel may be formed to have a thickness of 0.3-0.6 mm. The bezel may include a bottom portion on which the panel assembly is disposed and a sidewall formed on at least one side edge of the bottom portion.

The OLED display may further include a Flexible Printed Circuit Board (FPCB) affixed to the pad area and bent on a rear side of the bezel and a Printed Circuit Board (PCB) electrically connected to the panel assembly by the FPCB. The sidewall may be formed on side edges of the bottom portion except for a side edge where the FPCB is bent.

Alternatively, the bottom portion has a pair of short side edges and a pair of long side edges and the sidewall may be formed on the long side edges of the bottom portion and an extending portion may integrally extend from the sidewall to partly overlap a top surface of the panel assembly. The bezel may include at least one reinforcing portion formed by pressing downward on at least one of portions near four corners of the bottom portion. Alternatively, the bezel may include at least one reinforcing portion formed by pressing downward on a central portion of the bottom portion. Alternatively, the bezel may include at least one first reinforcing portion formed by pressing downward on at least one of portions near four corners of the bottom portion and at least one second reinforcing portion formed by pressing downward on a central portion of the bottom portion.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

The present invention is described more fully hereinafter with reference to the accompanying drawings, in which exemplary embodiments of the present invention are shown. As those skilled in the art would realize, the described embodiments may be modified in various different ways, all without departing from the spirit or scope of the present invention.

Figure 1:
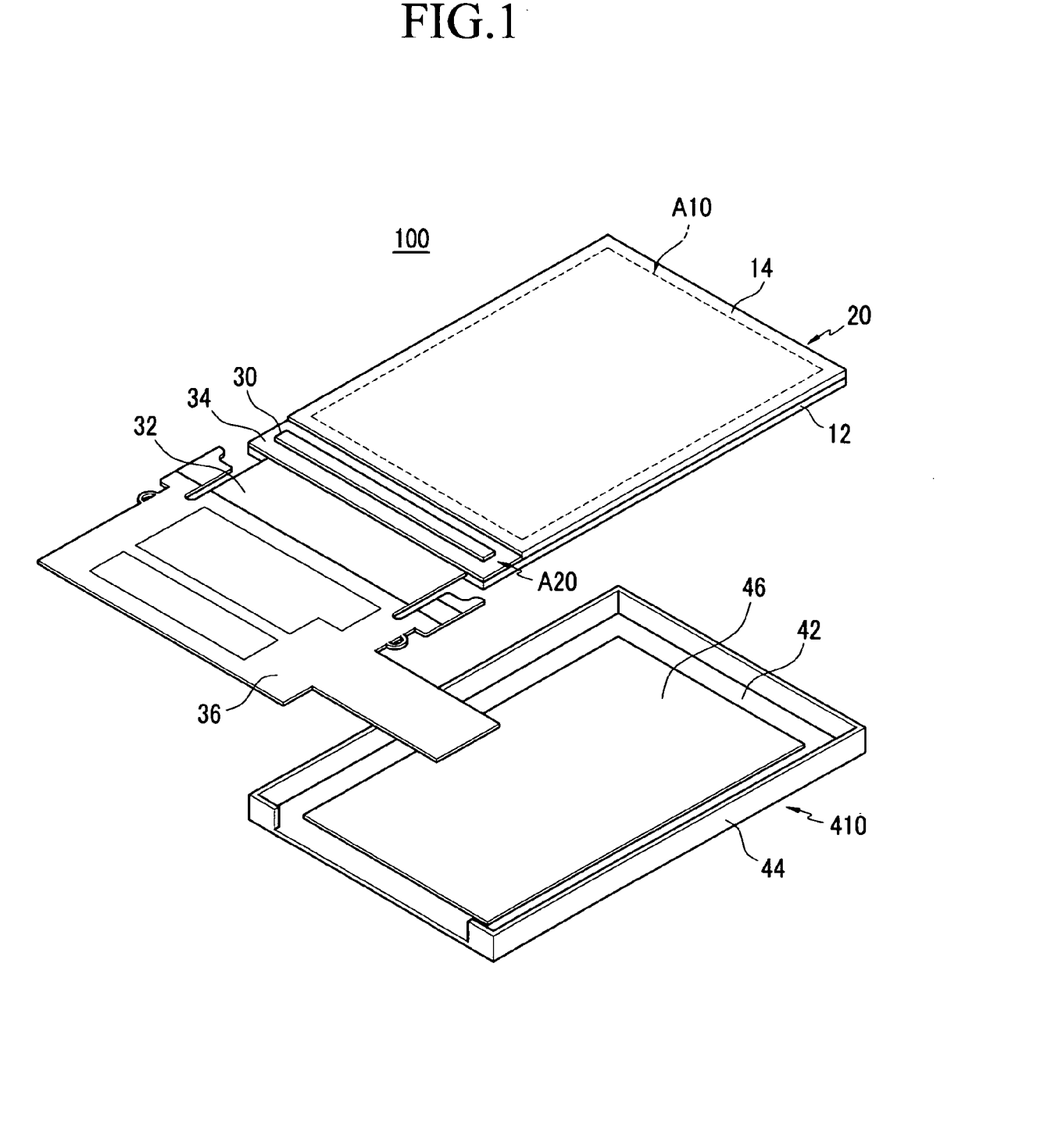
FIG. 1 is an exploded perspective view of an OLED display according to a first exemplary embodiment of the present invention.
Figure 2:
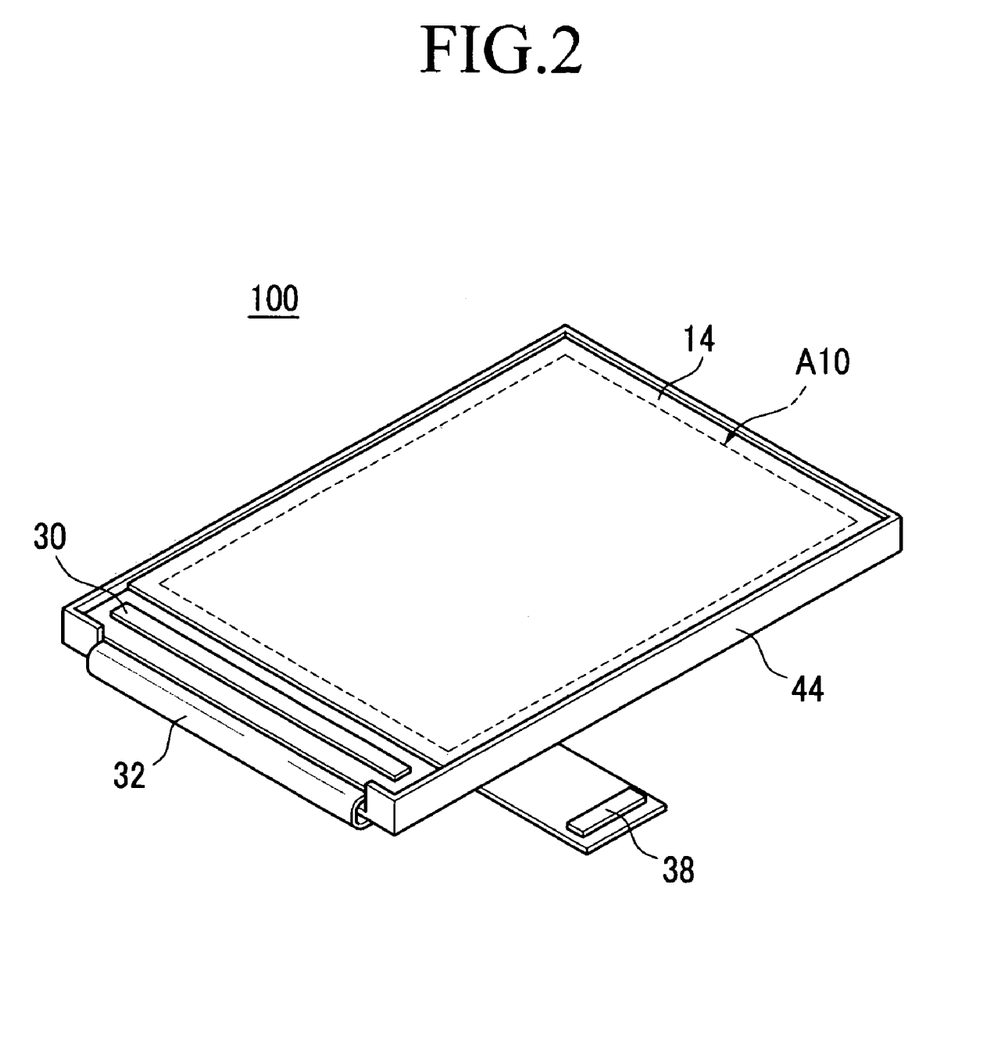
FIG. 2 is a perspective view of the OLED display of FIG. 1, when it is assembled.

FIG. 1 is an exploded perspective view of an OLED display according to a first exemplary embodiment of the present invention, and FIG. 2 is a perspective view of the OLED display of FIG. 1, when it is assembled.

Referring to FIGS. 1 and 2, an OLED display 100 of the present exemplary embodiment includes a panel assembly 20 having a display area A10 and a pad area A20 and displaying an image on the display area A10, a bezel 410 attached to the panel assembly 20 at a rear side of the panel assembly 20, and a Printed Circuit Board (PCB) 36 electrically connected to the panel assembly 20 via a Flexible Printed Circuit Board (FPCB) 32.

The panel assembly 20 includes a first substrate 12 and a second substrate 14 that is smaller than the first substrate 12 and has a peripheral portion attached to the first substrate 12 by a sealant. The display area A10 is defined as an overlapping region of the first and second substrates 12 and 14, which is surrounded by the sealant. The pad area A20 is defined as being outside of the sealant.

A plurality of sub-pixels is disposed in a matrix pattern in the display area A10 of the first substrate 12. Scan and data drivers (not shown) for driving the sub-pixels are located between the display area A10 and the sealant or outside of the sealant. Pad electrodes (not shown) for transferring electrical signals to the scan and data drivers are located in the pad area A20 of the first substrate 12.

Figure 3:
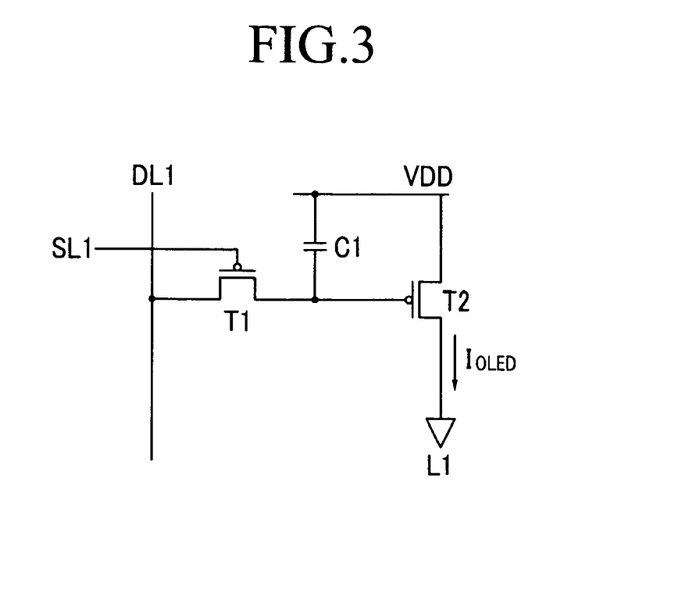
FIG. 3 is a circuit diagram of a sub-pixel circuit of the panel assembly of FIG. 1.
Figure 4:
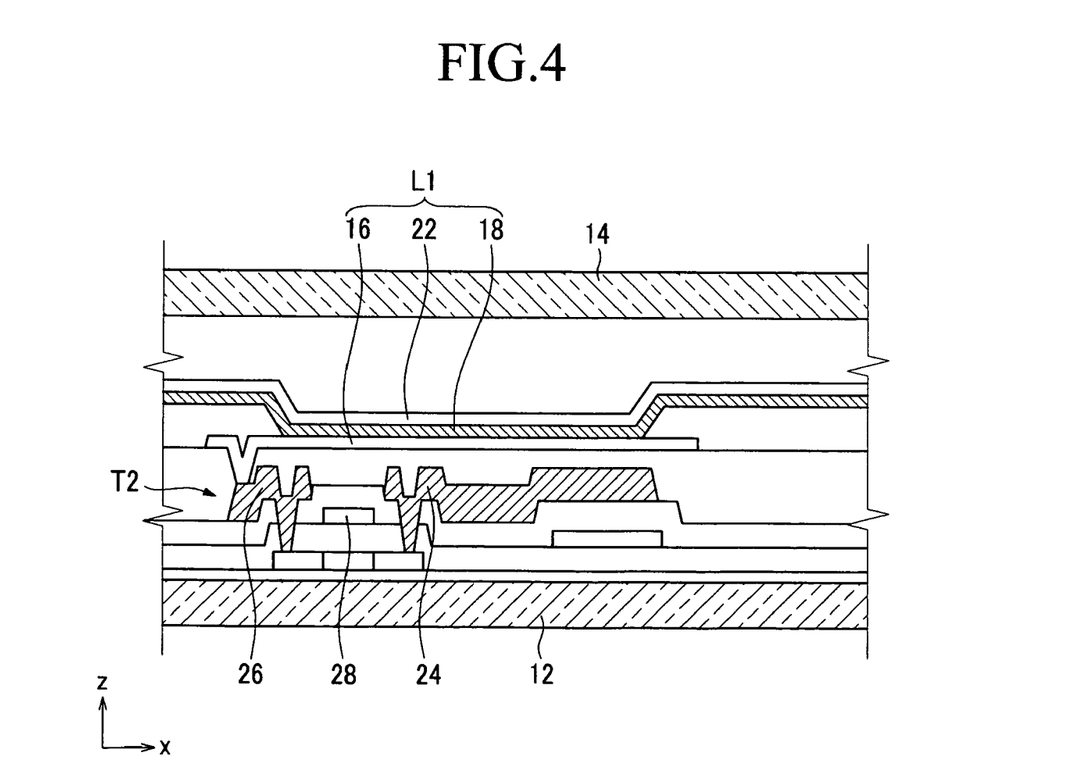
FIG. 4 is a partly enlarged cross-sectional view of the panel assembly of FIG. 1.

FIG. 3 is a circuit diagram of a sub-pixel circuit of the panel assembly 20 of FIG. 1, and FIG. 4 is a partly enlarged cross-sectional view of the panel assembly 20 of FIG. 1.

Referring to FIGS. 3 and 4, each of the sub-pixels of the panel assembly 20 includes an OLED L1 and a driving circuit. The OLED L1 includes an anode electrode 16, an organic light emitting layer 18, and a cathode electrode 22. The driving circuit includes at least two Thin Film Transistors (TFTs) and at least one storage capacitor C1. The TFTs include at least one switching transistor T1 and at least one driving transistor T2.

The switching transistor T1 is connected to scan and data lines SL1 and DL1 to transfer a data voltage, which is input from the data line DL1 in accordance with a switching voltage input to the scan line SL1, to the driving transistor T2. The storage capacitor C1 is connected to a power line VDD as well as to the switching transistor T1 in order to store a voltage corresponding to a difference between a voltage transferred from the switching transistor T1 and a voltage supplied by the power line VDD.

The driving transistor T2 is connected to both the power line VDD and the storage capacity C1 to supply an output current $I_{OLED}$, which corresponds to a square of a difference between a voltage stored in the storage capacity C1 and a threshold voltage, to the OLED L1 so that the OLED L1 can emit light due to the output current $I_{OLED}$. The driving transistor T2 includes a source electrode 24, a drain electrode 26, and a gate electrode 28. The anode electrode 16 of the OLED L1 is connected to the drain electrode 26 of the driving transistor T2. The above-described structure of the sub-pixels is merely exemplary and can be modified.

The second substrate 14 is attached to the first substrate 12 by the sealant at a predetermined interval to protect the driving circuit unit and the OLEDs on the first substrate 12 from an external environment. A polarizing plate (not shown) for suppressing reflection of external light may be located on an outer surface of the second substrate 14 at the display area A10. A moisture absorption agent may be attached to an inner surface of the second substrate 14.

Referring again to FIGS. 1 and 2, an Integrated Circuit (IC) chip 30 is mounted on the pad area A20 of the panel assembly 20 via a Chip-On-Glass (COG) method. The FPCB 32 is affixed to the pad area A20 of the panel assembly 20 via a Chip-On-Film (COF) method. A protective layer 34 is formed around the IC chip 30 and the FPCB 32 to cover and protect pad electrodes formed on the pad area A20.

A variety of electronic elements (not shown) for processing driving signals are mounted on the PCB 36. A connector 38 for transferring external signals to the PCB 36 is also installed on the PCB 36. The FPCB 32 affixed to the pad area A20 is folded toward a rear side of the bezel 410 to face the rear surface of the bezel 410.

The bezel 410 includes a bottom portion 42 on which the panel assembly 20 is disposed and a sidewall 44, which extends from side edges of the bottom portion 42 toward the panel assembly 20 to face side surfaces of the panel assembly 20 except for a side edge corresponding to the FPCB 32, is bent. A double-sided adhesive tape 46 is disposed between the bottom portion 42 of the bezel 410 and the panel assembly 20 to fix the panel assembly 20 to the bezel 410. The above-described structure of the bezel is merely exemplary and can be modified.

In the present exemplary embodiment, the bezel 410 may be formed of rubber having an excellent shock absorbing effect and a rebound resilience of 50-70%. For example, the bezel 410 may be formed of silicon-based rubber.

The silicon-based rubber has a stable chemical structure, and an excellent corrosion-resistance, heat-resistance, cold-resistance, electrical insulation, and abrasion-resistance properties.

In addition, the silicon-based rubber has an excellent shock absorbing property and thus, the bezel 410 formed of the silicon-based rubber can more effectively absorb external impact as compared to a bezel formed of metal or a hard synthetic resin.

The OLED display 100 must meet the reliability standard at a temperature within a range of from −30° C. to 70° C. when it is operating and from −40° C. to 85° C. when it is not operating. Since the silicon-based rubber can be used at a temperature within a range of from −40° C. to 230° C., it meets the bezel's operation characteristic at low and high temperatures.

The bezel 410 may be formed to have a minimum thickness of 0.3 mm. Even when the bezel 410 is formed with the minimum thickness of 0.3 mm, it has excellent shock absorbing ability. That is, the silicon-based rubber bezel 410 has more excellent shock absorbing ability than a synthetic resin bezel of the same thickness. For example, the bezel 410 may be formed to have a thickness of 0.3-0.6 mm. When the thickness of the bezel 410 is less than 0.3 mm, it is impossible to form the bezel 410. When the thickness of the bezel 410 is greater than 0.6 mm, an overall thickness of the OLED display 100 increases.

Since the bezel 410 is formed of rubber, the OLED display 100 of the present exemplary embodiment can reduce the external impact applied to the panel assembly 20 without using an additional shock absorbing member. That is, since the bezel is formed of the rubber and thus serves to absorb the external impact applied to the panel assembly 20, there is no need to further provide an additional shock absorbing member to the OLED display 100. Furthermore, since the bezel 410 formed of rubber is lighter than a bezel formed of metal or a synthetic resin, an overall weight of the OLED display 100 using the bezel 410 formed of rubber can be reduced. Therefore, when the OLED display 100 using the rubber bezel 410 collides with an external object or falls down to a floor, the impact energy thereby generated is relatively small.

Figure 5:
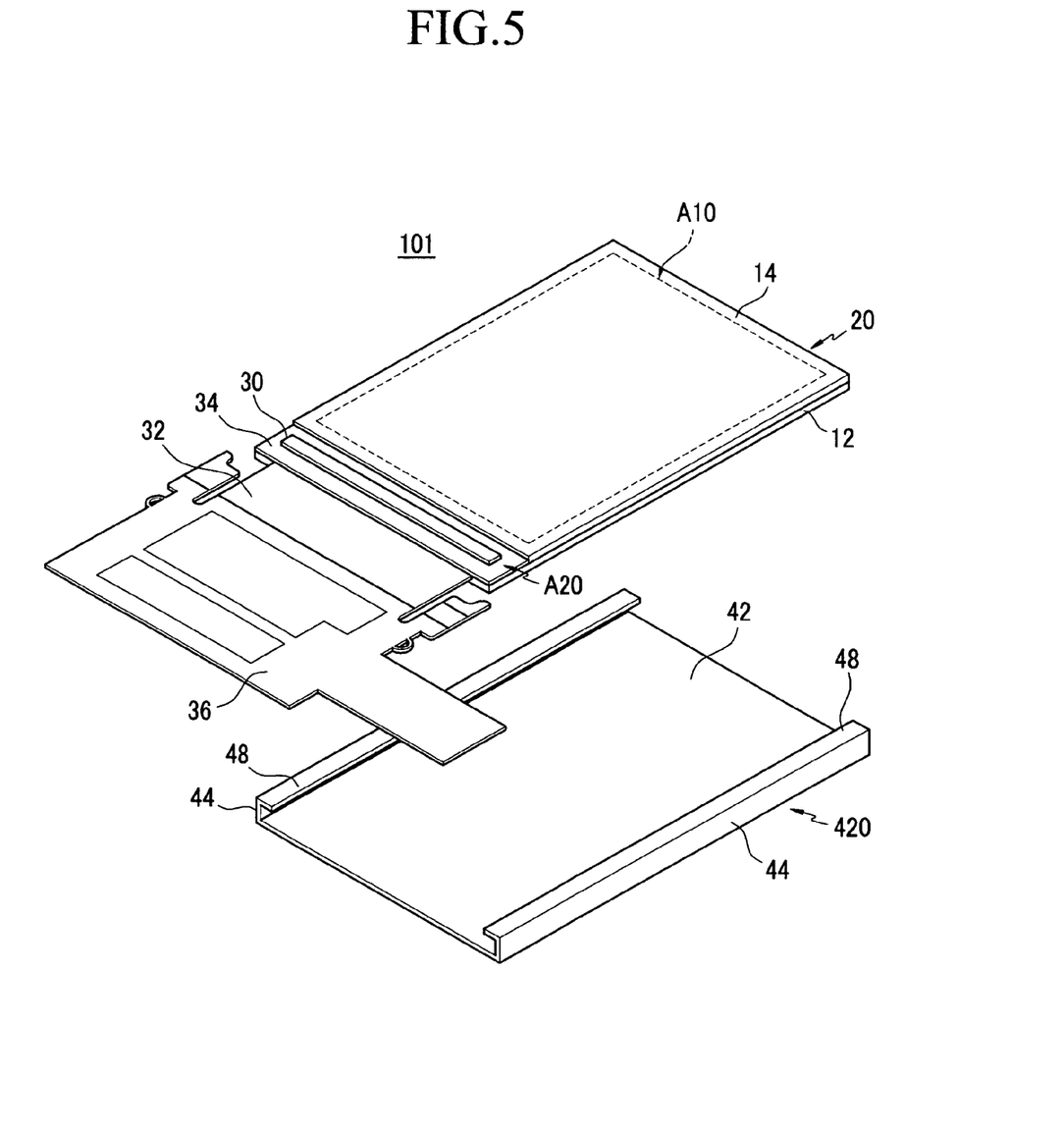
FIG. 5 is an exploded perspective view of an OLED display according to a second exemplary embodiment of the present invention.
Figure 6:
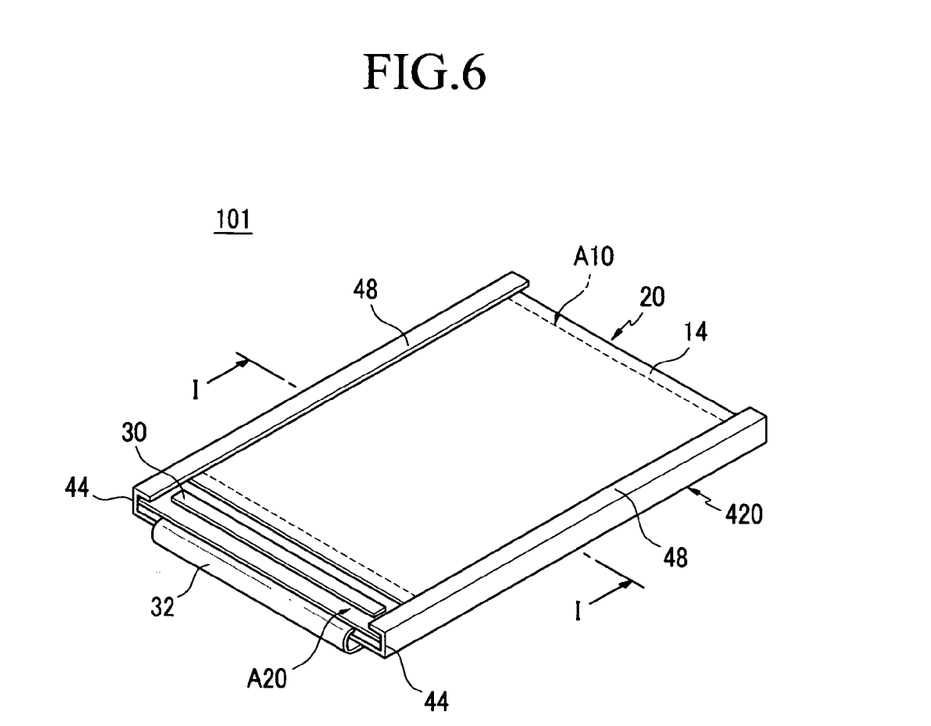
FIG. 6 is a perspective view of the OLED display of FIG. 5, when it is assembled.
Figure 7:
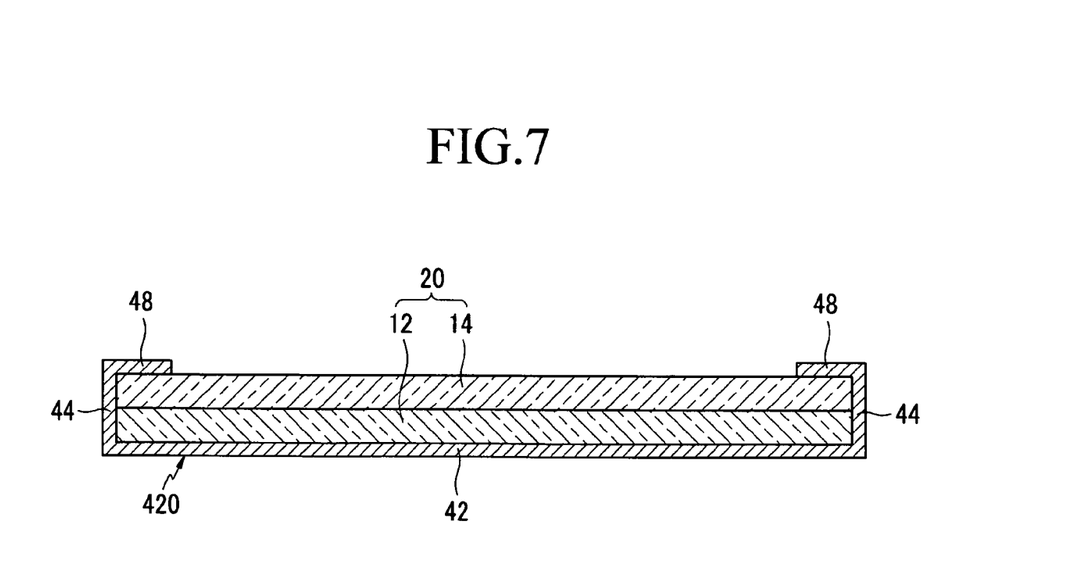
FIG. 7 is a cross-sectional view taken along line I-I of FIG. 6.

FIG. 5 is an exploded perspective view of an OLED display according to a second exemplary embodiment of the present invention, FIG. 6 is a perspective view of the OLED display of FIG. 1 when it is assembled, and FIG. 7 is a cross-sectional view taken along line I-I of FIG. 6.

Referring to FIGS. 5 to 7, an OLED display 101 of the present exemplary embodiment is similar to the OLED display of the first exemplary embodiment except that a sidewall 44 extend from long side edges of the bottom portion 42 to face long side surfaces of the panel assembly 20 and a extending portion 48 integrally extends from the sidewall 44 to either partly overlap or face a top surface of the panel assembly 20. In the first and second exemplary embodiments, like reference numerals are used to refer to the same or similar elements.

The panel assembly 20 is formed in a rectangular shape and the pad area A20 may be disposed on one of short side edges of the panel assembly 20. The bottom portion 42 of the bezel 420 includes a pair of long side edges and a pair of short side edges. The sidewall 44 and the extending portion 48 are formed at the long side edges of the bottom portion 42.

As described above, when the sidewall 44 and the extending portion 44 are formed to enclose the long side edges and a portion of the top surface of the panel assembly 20, the bezel 420 can more securely support the panel assembly 20. As a result, the bezel 420 can more effectively absorb external impact, such as drop impact, and thus the damage of the panel assembly 20, particularly, the damage incurred from a side surface of the panel assembly 20, can be minimized.

Figure 8:
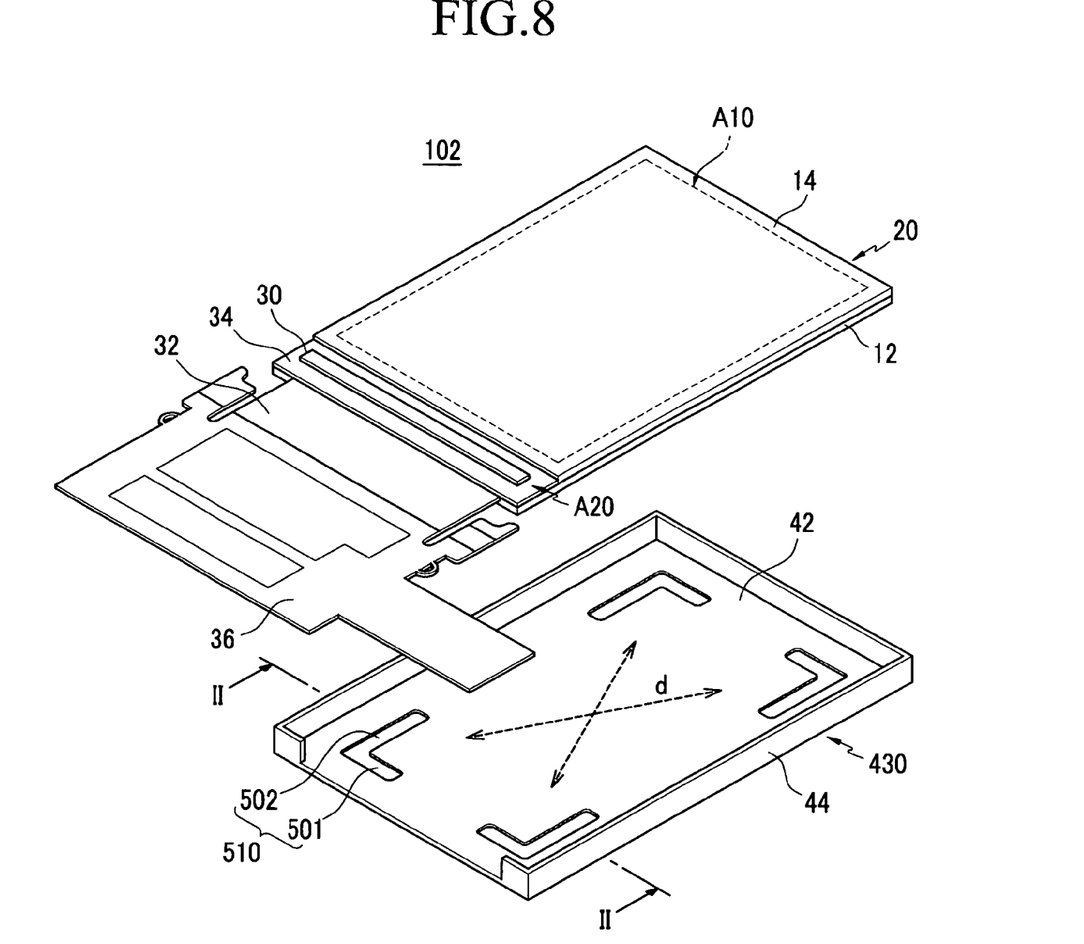
FIG. 8 is an exploded perspective view of an OLED display according to a third exemplary embodiment of the present invention.
Figure 9:
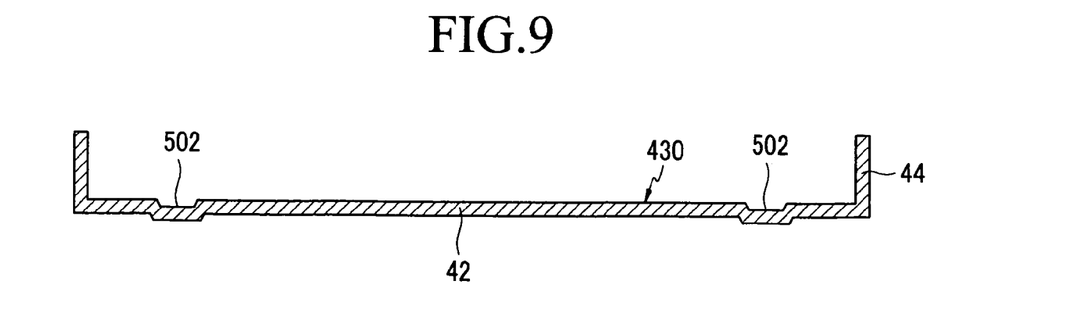
FIG. 9 is a cross-sectional view taken along line II-II of FIG. 8.

FIG. 8 is an exploded perspective view of an OLED display according to a third exemplary embodiment of the present invention and FIG. 9 is a cross-sectional view taken along line II-II of FIG. 8.

Referring to FIGS. 8 and 9, an OLED display 102 of the present exemplary embodiment is similar to those of the first and second exemplary embodiments except that at least one reinforcing portion 510 is formed on a bottom portion 42 of a bezel 430.

In FIGS. 8 and 9, the bezel 430 is formed to have the sidewall 44 of the first exemplary embodiment. However, the present invention is not limited to this configuration. That is, the bezel 430 may be formed with the sidewall and extending portion of the second exemplary embodiment. In the first and third exemplary embodiments, like reference numerals are used to refer to the same or similar elements.

When the bezel 430 is formed of a silicon-based material and has a thickness of about 0.3 mm, the mechanical strength of the bezel 430 may be less than that of the synthetic resin bezel. The reinforcing portion 510 is formed with a predetermined width and depth by pressing a portion of the bottom portion 42 downward to enhance bending strength in a diagonal direction (in a direction d in FIG. 8 as indicated by a dotted arrow) on the bottom portion 42 of the bezel 430, thereby enhancing the mechanical strength of the bezel 430.

The reinforcing portion 510 may be formed at each of four corners of the bottom portion 42. Each of the reinforcing portions 510 includes a horizontal portion 501 in parallel with a short side of the bottom portion 42 and a vertical portion 502 in parallel with a long side of the bottom portion 42.

The following is a description of a variety of modified examples of the bezel of FIGS. 8 and 9.

Figure 10:
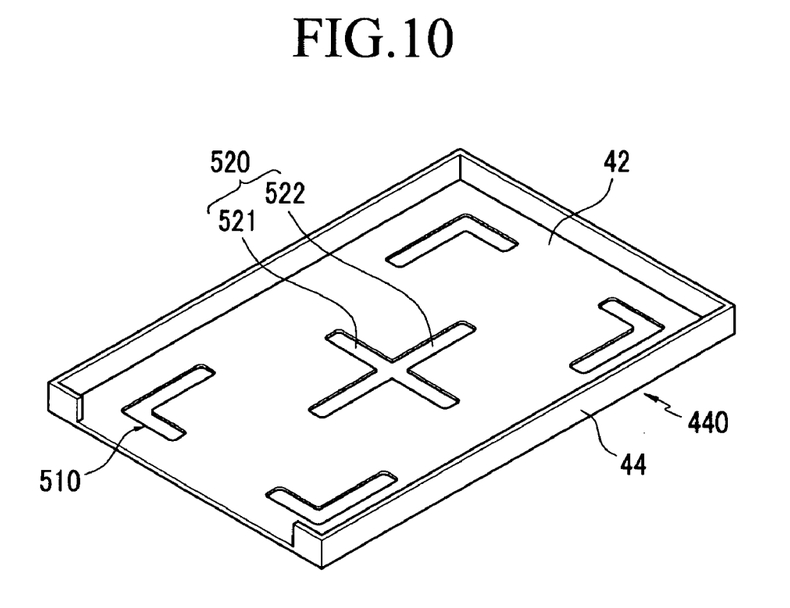
FIGS. 10 to 13 are perspective views of modified examples of the bezel of FIGS. 8 and 9.

FIG. 10 is a perspective view of a modified example of the bezel of FIGS. 8 and 9. When the reinforcing portions 510 formed at the respective four corners of the bottom portion 42 are referred to as "first reinforcing portions," a bezel 440 of this modified example further includes at least one second reinforcing portion 520 formed on a central portion of the bottom portion 42.

The second reinforcing portion 520 may be formed in a cross-shape having a horizontal portion 521 in parallel with a short side of the bottom portion 42 and a vertical portion in parallel with a long side of the bottom portion 42.

Figure 11:
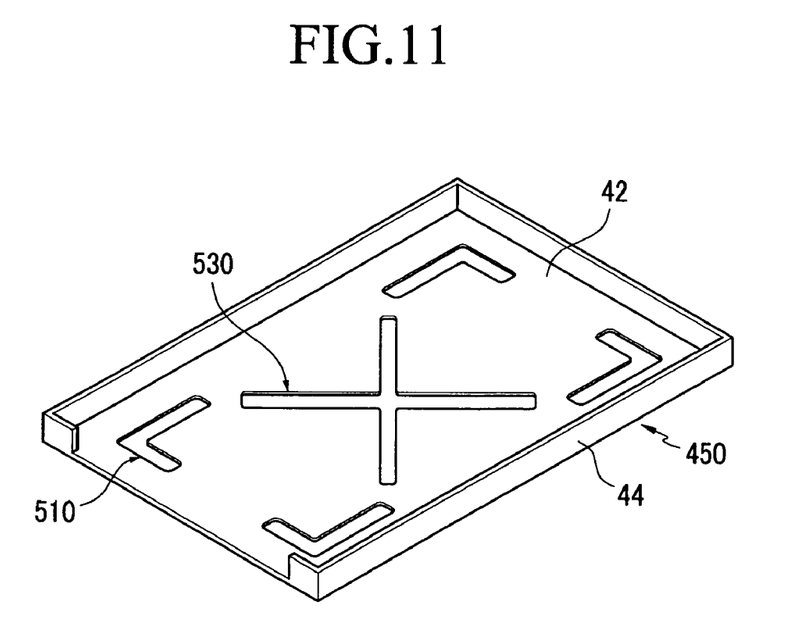

FIG. 11 is a perspective view of another modified example of the bezel of FIGS. 8 and 9. A bezel 450 of this modified example is the same as the bezel of FIG. 10 except that the bezel 450 further includes at least one second reinforcing portion 530 formed in an X-shape in addition to the first reinforcing portions.

Figure 12:
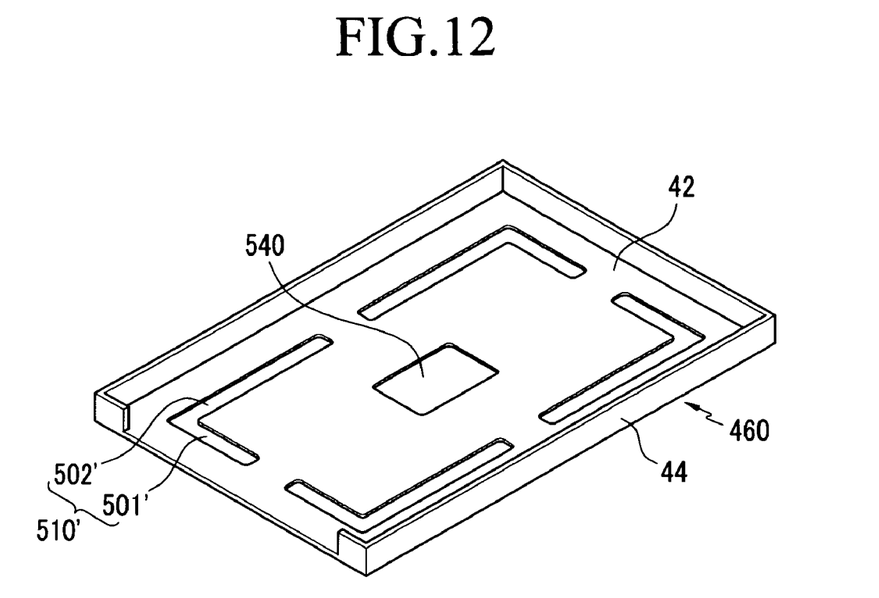

FIG. 12 is a perspective view of another modified example of the bezel of FIGS. 8 and 9. A bezel 460 of this modified example includes first reinforcing portions 510' each having a horizontal portion 501' and a vertical portion 502' that are longer than those of the third exemplary embodiment and at least one second reinforcing portion 540 formed in a rectangular shape.

Figure 13:
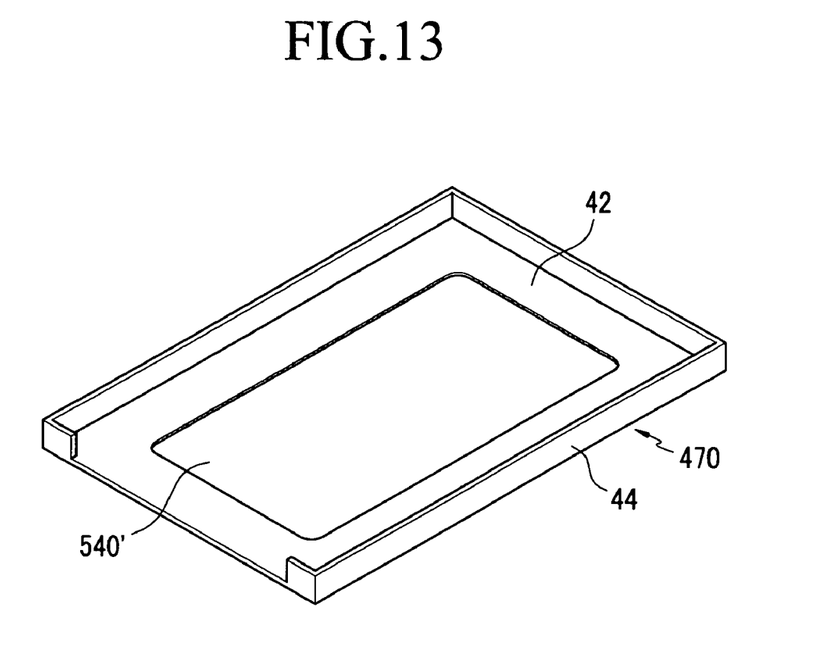

FIG. 13 is a perspective view of another modified example of the bezel of FIGS. 8 and 9. A bezel 470 of this modified example includes a second reinforcing portion 540' formed on the bottom portion 42 while the first reinforcing portions are omitted. The second reinforcing portion 540' may be formed to be larger than that of the bezel of FIG. 12 but spaced apart from the sidewall 44 by a predetermined distance.

While the present invention has been described in connection with what is presently considered to be practical exemplary embodiments, it is to be understood that the present invention is not limited to the disclosed embodiments, but, on the contrary, is intended to cover various modifications and equivalent arrangements included within the spirit and scope of the appended claims.

What is claimed is:

1. An organic light emitting diode (OLED) display device, comprising:
    a panel assembly comprising two substrates disposed opposite to and spaced apart from each other, and a plurality of OLEDs arranged between the two substrates, the panel assembly comprising a display area within which the plurality of OLEDs are disposed and a pad area different from the display area; and
    a bezel comprising a bottom portion completely covering one of the two substrates, and a sidewall extending from an edge of the bottom portion along a side surface of the panel assembly, with the bezel having a rebound resilience in a range of 50-70%.

2. The OLED display device of claim 1, wherein the bezel comprises a silicon-based rubber.

3. The OLED display device of claim 2, wherein the bezel has a thickness in a range of 0.3-0.6 mm.

4. The OLED display device of claim 1, further comprising:
    a Flexible Printed Circuit Board (FPCB) affixed to the pad area and bent on a rear side of the bezel; and
    a Printed Circuit Board (PCB) electrically connected to the panel assembly by the FPCB.

5. The OLED display device of claim 4, wherein the sidewall is formed on side edges of the bottom portion except for a side edge where the FPCB is bent.

6. The OLED display device of claim 1, wherein the bottom portion has a pair of short side edges and a pair of long side edges; and the sidewall is formed on the long side edges of the bottom portion and an extending portion integrally extends from the sidewall to partly overlap a top surface of the panel assembly.

7. The OLED display device of claim 1, wherein the bezel comprises at least one reinforcing portion pressed downward into at least one of portions near four corners of the bottom portion.

8. The OLED display device of claim 1, wherein the bezel comprises at least one reinforcing portion pressed downward into a central portion of the bottom portion.

9. The OLED display device of claim 1, wherein the bezel comprises at least one first reinforcing portion pressed downward into at least one of portions near four corners of the bottom portion and at least one second reinforcing portion pressed downward into a central portion of the bottom portion.

* * * * *